US008137575B2

(12) United States Patent
Piel et al.

(10) Patent No.: US 8,137,575 B2
(45) Date of Patent: Mar. 20, 2012

(54) METHOD FOR METALLIZING INSULATING SUBSTRATES WHEREIN THE ROUGHENING AND ETCHING PROCESSES ARE CONTROLLED BY MEANS OF GLOSS MEASUREMENT

(75) Inventors: Merten Piel, Berlin (DE); Brigitte Steder, legal representative, Karlsruhe (DE); Rolf Piel, legal representative, Hamburg (DE); Elke Piel, legal representative, Hamburg (DE); Lutz Stamp, Berlin (DE); Christiane Moepert, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 642 days.

(21) Appl. No.: 11/577,494

(22) PCT Filed: Oct. 19, 2005

(86) PCT No.: PCT/EP2005/011231
§ 371 (c)(1),
(2), (4) Date: Apr. 27, 2009

(87) PCT Pub. No.: WO2006/050792
PCT Pub. Date: May 18, 2006

(65) Prior Publication Data
US 2009/0200263 A1    Aug. 13, 2009

(30) Foreign Application Priority Data
Nov. 10, 2004   (EP) .................................... 04026653

(51) Int. Cl.
*B44C 1/22* (2006.01)
*C03C 15/00* (2006.01)
*C03C 25/68* (2006.01)
(52) U.S. Cl. ................. 216/58; 216/83; 216/84; 216/85
(58) Field of Classification Search ........................ None
See application file for complete search history.

(56) References Cited

U.S. PATENT DOCUMENTS
2,702,253 A    2/1955   Bergstrom et al.
(Continued)

FOREIGN PATENT DOCUMENTS
JP   59251230   6/1986
(Continued)

OTHER PUBLICATIONS
Norbert Muenzel et al., New Laser Dielectric Material for Microvia Technology, IPC Printed Circuits Expo, 1998, pp. S01-2-1 to SO1-2-4, 31, and 45, Published by IPC, Long Beach, California.
(Continued)

*Primary Examiner* — Duy Deo
(74) *Attorney, Agent, or Firm* — McDonnell Boehnen Hulbert & Berghoff LLP

(57) ABSTRACT

The invention relates to a control of etching processes of insulating substrates by means of gloss measurement. By this method a surface roughness can be achieved which leads to good adhesion of metals layers deposited in subsequent metallization steps. This method is particularly suited for the production of printed circuit boards.

9 Claims, 2 Drawing Sheets

U.S. PATENT DOCUMENTS

| | | | |
|---|---|---|---|
| 3,506,397 A | | 4/1970 | Vincent et al. |
| 3,598,630 A | | 8/1971 | Doty et al. |
| 3,647,699 A | | 3/1972 | Doty et al. |
| 4,452,664 A | * | 6/1984 | Grey et al. .................. 216/36 |
| 5,019,229 A | | 5/1991 | Grapentin et al. |
| 6,139,930 A | * | 10/2000 | Comer et al. ............. 428/36.5 |
| 6,612,028 B1 | | 9/2003 | Shirai |
| 2009/0166213 A1 | * | 7/2009 | Dobashi et al. ............ 205/296 |

FOREIGN PATENT DOCUMENTS

| | | |
|---|---|---|
| JP | 60014677 | 8/1986 |
| JP | 63128389 | 12/1989 |

OTHER PUBLICATIONS

Clyde F. Coombs, Jr, Printed Circuits Handbook, Second Edition, pp. 1-25, McGraw-Hill Book Company New York, St. Louis, San Francisco, Auckland, Bogota Dusseldorf, Johannesburg, London, Madrid, Mexico, Montreal, New Delhi, Panama, Paris, Sao Paulo, Singapore, Sydney, Tokyo, Toronto.

International Search Report, Form PCT/ISA/210, 4 sheets.

Written Opinion of the International Searching Authority, Form PCT/ISA/237, 5 sheets.

* cited by examiner

Figure 1
different stages of etching SAP base materials example values:

| | rel. Gloss | aver. Roughness | Peelstrength |
|---|---|---|---|

0. directly after lamination (no roughening, maximal smoothness and gloss)

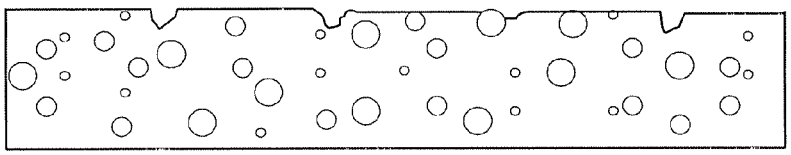

100%    0,2µm    4,0N/cm 1. slight roughening

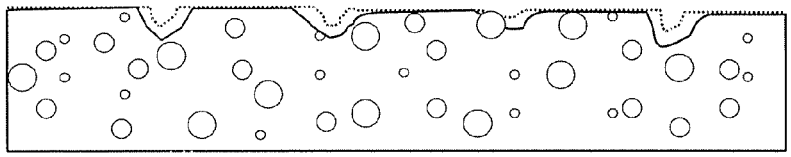

80%    0,4µm    6,5N/cm 2. optimal roughening and etching level

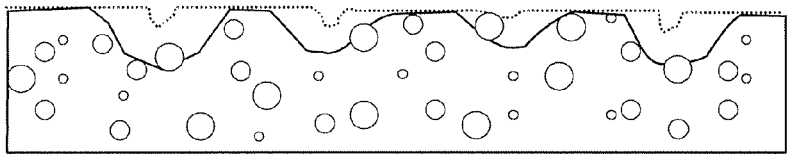

50%    0,7µm    9,0N/cm 3. strong roughening (slight over etching)

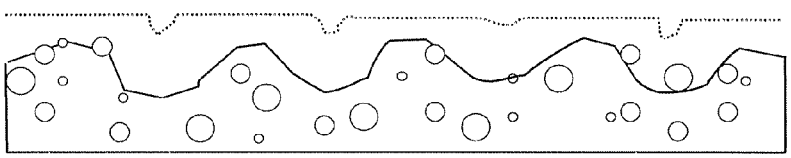

30%    0,8µm    8,0N/cm 4. over etching (may be combined with smoothening)

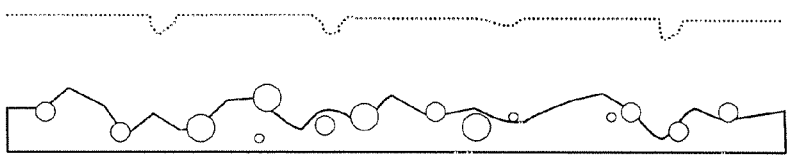

20%    0,6µm    7,0N/cm

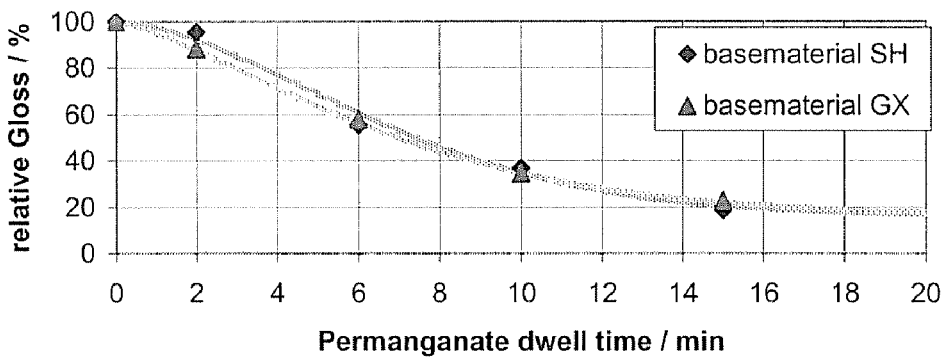
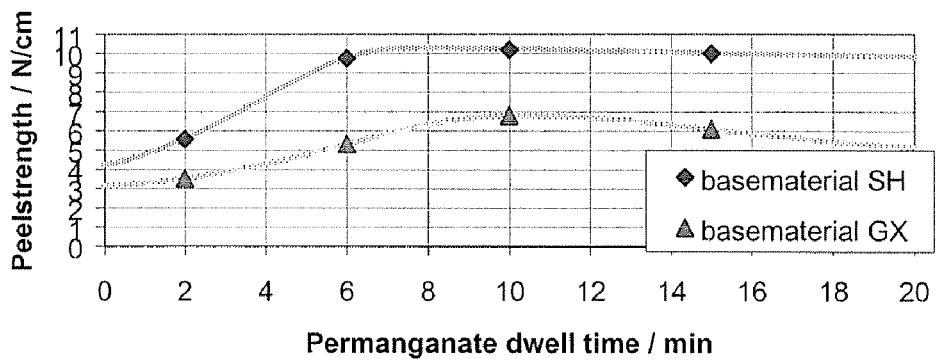
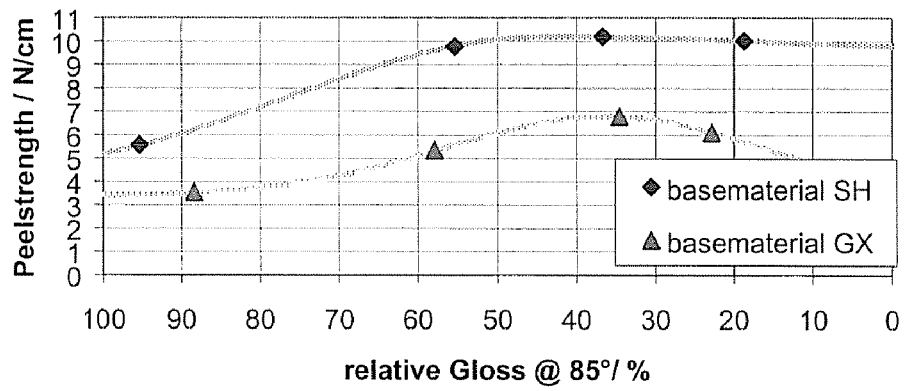

METHOD FOR METALLIZING INSULATING SUBSTRATES WHEREIN THE ROUGHENING AND ETCHING PROCESSES ARE CONTROLLED BY MEANS OF GLOSS MEASUREMENT

DESCRIPTION OF THE INVENTION

The invention relates to a method for metallizing insulating substrates by etching the insulating substrates with etching solutions at a concentration, at a temperature and for a time sufficient to achieve roughening of the surface of said substrates and subsequent metallization, wherein the roughening and etching processes are controlled by means of gloss measurement. By this method a surface roughness can be achieved which leads to good adhesion of metals layers deposited in subsequent metallization steps. This method is particularly suited for the production of printed circuit boards.

Prior to the metallization of non-conductive substrates, pretreatment of the surface is necessary in order to achieve good adhesion properties of the metal coat. The adhesion properties may be measured as peel strength. Generally a peel strength of preferably 2-20 N/cm, most preferably 6-10 N/cm is required.

The kind of plastics to be used is not specifically limited, and includes various plastics heretofore known. Examples are general-purpose plastics heretofore extensively used for chemical plating such as ABS resins, general-purpose engineering plastics having a heat resistance at 150° C. or less, such as polyamides (nylon PA), polyacetals (POM), polycarbonates (PC), modified polyphenylene ethers (PPE), polybutylene terephthalates (PBT) and the like, super engineering plastics having a heat resistance at 200° C. or more, such as polyphenylene sulfides (PPS), polyether sulfones (PES), polyether imides (PEI), polyether ether ketones (PEEK), polyimides (PI), liquid crystal polymers (LCP) and the like, polymer alloys such as polycarbonate/ABS resins and the like.

Base materials used for the production of printed circuit boards (PCB's) comprise, for example, a rigid non-conducting or dielectric base made up of a fibrous material such as glass fibers, paper and the like in combination with a polymer such as an epoxy resin. Multilayer boards (MLB's) comprise several PCB's laminated to one another by means of an adhesive. In addition to rigid boards (as described above), flexible boards can be produced employing thermoplastic dielectric layers such as fluorocarbon polymers, Nylon polymers, polyimides, Kevlar-reinforced polymers, polyparabanic acids and polyesters. Flexible boards are manufactured without fiber reinforcing. Production of both of these types of printed circuit boards are described in Printed Circuits Handbook, Second Edition, edited by C. F. Coombs, Jr., McGraw-Hill, 1979, which is incorporated herein by reference. Laminated combinations of flexible and rigid boards are also finding utility in some applications for MLB's.

Additionally substrates can be applied which comprise rigid base layers and non-reinforced layers made for example from epoxy resin.

In a first step a substrate is treated with a swelling solution. Conventional swellers which usually comprise an organic swelling agent and a base like sodium hydroxide can be used.

Subsequently the surface of the substrate to be treated is etched. The etching treatment selectively dissolves the surface of resin substrate to achieve an anchor effect. This treatment can improve the adhesion of the electroplated coating and the appearance of the coating surface. The etching procedure is carried out by various methods. For example, the substrate to be treated is immersed in a properly heated mixed solution of chromic acid and sulfuric acid. When a substrate of ABS resin is treated, the etching treatment dissolves out butadiene rubber as a constituent due to oxidative effect of chromic acid, giving anchor pores of about 1 to about 2 μm in pore size on the resin substrate, while the butadiene is caused to undergo oxidative decomposition, producing a polar group such as a carbonyl group.

After pretreatment and prior to applying the metal coat, and in order to promote its deposition on the non-conductive surface, the non-conductive surface is treated—for example with a two step activator comprising a stannous chloride sensitizer solution followed by a sensitizer solution of divalent palladium chloride according to the process of Bergstrom et al., U.S. Pat. No. 2,702,253.

Thereafter a first and often second and final metal layer is being deposited. The applied electroless metal coating often is copper. In this case, a solution being applied contains cupric ions and a reducing agent such as formaldehyde, which reduces the cupric ions in the solution to copper metal when in the presence of palladium, which acts as a catalyst for the reduction. The electroless copper may have subsequent metal coatings applied to it by electrolytic means.

When manufacturing multilayer circuits, it is necessary to carry out a preliminary process to remove resin smears resulting from forming a bore. The removal of these smears should insure a reliable contact of conducting multilayers-copper inner layers with a chemically formed copper coating. The purification of the bore effected by removal of epoxide, with simultaneous roughening of the outer surface of the substrate, insures in addition a better adhesion of the subsequently deposited metal coating.

Since roughening of the substrate surface and desmear are achieved at the same time, only one of both parameters has to be controlled during the treatment. In the following, the term "etching" is used to denote both roughening of the surface and desmear where applicable.

Good adhesion of the metal layer is important above all because of the thermal load which the circuit board is exposed to during subsequent soldering. It is known to carry out the above-mentioned preliminary process with alkaline potassium or sodium permanganate solutions, when, as a rule, before oxidation, swelling with an organic solvent and/or a surface-active agent is carried out, which however requires significant treatment time. Because, in most cases, only small backetching rates are achieved, it has already been proposed to increase the etching rates, for example, by using ultrasound, increase of the temperature, increase of the concentration of permanganate by using sodium permanganate or increase of OH-ion concentration.

Numerous methods are known for removing resin smear and roughening the surface of an insulating surface. One approach is a mechanical one and involves channeling a dry or wet stream of abrasive particles through such holes. A similar method is the use of hydraulic pressure to force a thick slurry of abrasive material through the holes. However, these mechanical methods are generally slow and difficult to control. Furthermore, complete removal or smear in all holes in a given circuit board is difficult to achieve.

Chemical methods have also been used to desmear holes. Generally, the chemicals used attack the smeared resinous coating. The chemicals include, for example, concentrated sulfuric acid (down to about 90 percent concentration). Smeared epoxy resin, which is usually less than about 0.001 inch thick, can be removed with about one minute's treatment with concentrated sulfuric acid. Unfortunately, the high sulfuric acid concentration required is very hazardous and requires extraordinary precautions by operators. Also, undesirably rough holes are produced. In addition, the concentrated sulfuric acid rapidly absorbs water, which limits its useful life span and can cause variations in the immersion times required to desmear the holes.

Another chemical smear removal agent which has been employed is chromic acid. While it is easier to control etch rates with chromic acid because it is a slower etchant than concentrated sulfuric acid, it still requires operator caution and special equipment. Permanganate has also been used for smear removal and for etching of various materials For example.

U.S. Pat. No. 3,506,397 relates to the treatment of ABS resin with a composition containing phosphoric acid and potassium permanganate.

U.S. Pat. No. 3,598,630 and U.S. Pat. No. 3,647,699 are also related to phosphoric acid/potassium permanganate solutions for treating ABS polymers.

Increased etching efficiency has also become desirable because in many situations it is necessary that the etchant composition not only be capable of desmearing small areas of resin, but also be capable of "etching back" the resin. The term "etchback" is used in the art to refer to the removal of resin from, for example, the barrel of a hole in a printed circuit board to expose a portion of the layers of copper or the like. In essence then, the copper layer protrudes slightly into the hole in the board. While for practical purposes etchback is any resin removal which is greater than simple desmearing, in some cases rather specific etchback requirements are necessary.

U.S. Pat. No. 5,019,229 describes a method of and an apparatus for etching an epoxy resin having a high backetching rate, in particular bores with printed circuit boards, with stable, strong, basic alkaline permanganate etching solution wherein the solution is stabilized by electrochemical anodal oxidation, and permanganate and OH-ion concentration is controlled by measuring the same by using electrochemical and/or photometric measuring method with subsequent metering of the solution in accordance with deviation of a measurement value from a nominal value.

The methods for improving the control of roughening and desmear developed so far have been almost exclusively focused on optimizing the composition of the etching solution. They all have the drawback that during the process the chemical composition and concentration of the compounds changes which results in unreliable desmear and roughening results.

The control of etching of a copper metal surface with optical devices is already known from the literature. In JP 01-298790 the etching completion time in fabrication of printed circuit boards is determined by observing the intensity change of a monitoring light reflected from the board. For etching solutions for copper containing ammonium salts, the proper wavelength described is 390-496 nm. The reflected light intensity changes used for the endpoint determination may also be used for controlling such conditions as a rate of transporting the laminates, concentration of the etching solution, etching temperature, etching solution feed rate and etchant removal conditions.

Muenzel et al. in "New dielectric materials for microvia technolgy", Technical paper S01-1, IPC, 1998, p.14 found that gloss and copper peel strength depend on the curing temperature of the metallized base material. A one hour bake at a temperature of 150° C. was used after 0.7 µm chemical copper plating. The measured peel strength data correlate with the enhanced surface roughness achieved at higher curing temperatures. However, Muenzel et al. do not teach the correlation between the peel strength and surface gloss/roughness and the utilization of its optimum ratio in controlling desmear/etching processes. Furthermore, Muenzel et al. suggest that only a higher curing temperature leads to increased peel strength.

Therefore, it is the aim of the present invention to provide a method for easy and reliable control of the roughening and desmear processes for non-conductive surfaces.

This aim is achieved by a method for metallizing insulating substrates comprising the steps of etching said insulating substrates with etching solutions at a concentration, at a temperature and for a time sufficient to achieve roughening and/or desmear of the surface of said substrates, and subsequent metallizing, which method comprises the following steps:

(i) etching the substrates using varying etching parameters selected from etching temperature, etching time and etchant concentration,
(ii) determining the gloss value of the surface of the etched substrates obtained in step (i) above by an optical gloss device,
(iii) metallizing the etched substrates obtained in step (i) above,
(iv) determining the peel strength of the metallized substrates obtained in (iii) above,
(v) correlating the peel strength and the gloss value obtained in (ii) and (iv) above,
(vi) using said correlation to determine the gloss value correlating with the maximum peel strength and
(vii) controlling the etching parameters such that any deviation of the actual gloss value from the gloss value obtained in step (vi) is minimized.

Thus, according to the present invention, an easy to apply optical control device is used to monitor the etching process in order to achieve the desired surface appearance and a good adhesion during the metallization steps.

BRIEF DESCRIPTION OF THE DRAWINGS

FIG. 1 is a schematic timeline illustration of the etching process of the invention showing changes in the parameters of gloss, roughness and peel strength.

FIG. 2 is a graph of relative gloss versus permanganate dwell time and shows a decrease in relative gloss in percent versus the dwell (etching) time for a permanganate etch system of the invention.

FIG. 3 is a graph of peel strength versus permanganate dwell time for a permanganate etch system of the invention.

FIG. 4 is a graph showing the relationship of peel strength of a metal coating to the relative gloss value.

Surprisingly, the applicant found a clear correlation between the gloss of the treated substrate surface and the peel strength of metal coats deposited subsequently. This correlation can be used to determine optimized treatment parameters for various substrate materials irrespective of the etching composition used. Therefore, it offers a method which is universally applicable for all kinds of surface treatment processes.

Typical parameters used to control the etching process are treatment time, temperature and concentrations of compounds applied in the etch solutions.

For this purpose a standard gloss meter like REFO 3-D by Hach Lange is applied. Gloss meters are devices that illuminate a test surface at a defined angle of incidence and measure the amount of light at a defined angle of reflection. Specular gloss is quantified by measuring the amount of light reflected from the sample and comparing it with the amount of light reflected when a polished black glass calibration standard is measured under the same conditions. The glass standard is assigned a value of 100 gloss units and in practice the highest attainable gloss values for non-metallic paints tend towards 95 gloss units.

Additionally to the absolute gloss value, a relative gloss value may be assigned in the current invention. It is set to 100% per definition for the amount of light reflected from the corresponding substrate without applying swelling and desmear processes:

$$\text{relative gloss value} = \frac{\text{current gloss value}}{\text{gloss value of unetched surface}} \cdot 100\%$$

In the present invention the decrease of gloss (ratio between starting value and actual value) after treatment in the etching baths correlates well with the degree of surface roughening (the area of the original smooth outer layer diminishes). This—at first—leads to an increase in peel strength.

As shown in FIG. 1, further etching may lead to lower peel strength values (over etching), this can still be seen and judged by a further decrease of gloss, but often not in any increase of roughness data (e.g. obtained by interferometer).

The knowledge of the relation between gloss and peel strength enables a constant control of the etching process within an optimal range.

Possible changes in the power of etching attack (e.g. during ageing of production bathes) can be easily discovered and corrected.

One suitable instrument for gloss measurement is the REFO 3-D reflectometer by Hach Lange with inspection angles of 20°, 60° and 85°. A preferred angle for the present purpose is 85°.

Advantages of the present invention are:
Ability of controlling the roughening process within an optimal range regarding:
minimum possible roughness and maximum possible peel strength of the applied metal layers
Easy, fast and cheap analysis (online analysis is possible)
Non-destructive analysis (non touching, automatic measurement is possible)
Cost saving compared to usually necessary analysis method consisting of plating (electrolessly & galvanically) followed by tempering and peel strength measurement
Possibility of statistical evaluation of evenness of resin cure process (lamination) and desmear process, e.g. within each panel (different areas) or per basket or per lot The determination of the treatment parameters of the substrate in the etching composition is in the following explained for adjusting the treatment time. It may similarly also applied for optimizing other suitable parameters.

After applying a sweller, the insulating substrate is treated with an etching composition at different etch times. Practically useful have proven intervals of t/min=0, 2, 6, 8, 10, 12, 15, 20, 25, 30. In most cases, a maximum treatment time of 15 min is useful.

Any suitable etching solution can be used for etching a non-conductive substrate.

Solutions based on permanganate and chromic acid respectively are most widely used. The term "etchant concentration" is in the following described choosing these two solutions, but may as well be applied to any other etching solution.

Etching solutions based on permanganate contain either potassium or sodium permanganate, optionally sodium and potassium manganate and one or more bases to adjust the pH to a value of about 13-14.

Preferred concentrations of potassium permanganate are 10-150 g/l, more preferably 40-100 g/l, of sodium permanganate 20-200 g/l, more preferably 60-100 g/l. Sodium and potassium manganate can be applied in preferred concentrations of 5-50 g/l. Bases used can be sodium or potassium hydroxide in a concentration of 20-200 g/l and sodium or potassium carbonate (20-200 g/l) etc.

In this case etchant concentration relates to the concentration of sodium or potassium permanagante, sodium or potassium managante and the bases, for example sodium or potassium hydroxide or sodium or potassium carbonate Etching solutions based on sulfuric acid and chromic anhydride generally contain sulfuric acid in a concentration of about 50-1500 g/l, more preferably 200-800 g/l and chromic anhydride in a concentration of about 30-800 g/l, more preferably 50-300 g/l. Etchant concentration relates to the concentration of sulfuric acid and chromic acid.

FIG. 2 shows the decrease in relative gloss in % versus the dwell time (etching time) for a permanganate etch system.

After the etching steps the such treated substrate is metallized, preferably with copper. After metallization the peel strength of the coating is measured. The peel strength is an indicator for the adhesion properties of the metal coating.

Generally a peel strength of preferably 2-20 N/cm, most preferably 6-10 N/cm is required.

The peel strength was measured by pulling stripes of 10 mm width of the metal layer deposited at a speed of 40 mm/min using a drawing automat LCTM-6 by Chatillon and a Strength Measuring Instrument 708 manufactured by Erichsen.

As can be seen from FIG. 3, the peel strength depends from the dwelling time of the etching composition. It first increases with dwelling time, reaches a maximum and then decreases again. With the method according to the present invention an optimum dwelling time can easily be determined by choosing the maximum peel strength at a minimum dwelling time from a graph according to FIG. 3. For example, according to FIG. 3 one would choose a dwelling time for the described permanganate etching composition of about 8-12 min. for both substrates.

FIG. 4 illustrates the dependence of the peel strength of the metal coating from the relative gloss value. A maximum peel strength is achieved at a gloss value of about 55%.

Once the most suitable gloss value has been determined for a certain substrate base material, both the relative and absolute gloss value can be applied to monitor etching processes continuously. In other words, once the correlation between the gloss value and the peel strength has been determined by proceeding as outlined above, it is only necessary to control the etching parameters such that any deviation of the actual gloss value measured in the etching process from the predetermined gloss value correlating with the maximum peel strength is minimized.

The invention is more specifically described by the following examples.

The base material used is either ABF-SH or GX (halogen-free), products of Ajinomoto Fine-Techno Co., Inc. Japan. All tests have been performed under the same conditions.

An overview over the process steps and conditions applied is given in Table 1.

After the usual pretreatment of the substrates according to the step 1, the substrate is then exposed to an etching composition with a composition according to step 2.

The gloss is measured before and after the swelling and etching steps. An overview of the results is given in Table 2. The substrate is then metallized with copper applying a standard process Neoganth by Atotech Deutschland GmbH and as described in the process steps 4.-12. in Table 1. The resulting peel strength of the copper coating is shown in Table 2.

EXAMPLE CONDITIONS

TABLE 1

Process steps for treatment of insulating substrates applying an acidic manganate/permanganate etching solution

| | | Temperature T/° C. | Time t/min |
|---|---|---|---|
| a) gloss measurement at an angle of 85° (before desmear) | | | |
| 1. Sweller: | | 80 | var. |
| Securiganth MV Sweller conc. | 500 ml/l | | |
| NaOH | 3 g/l | | |
| 2. Permanganate: | | 80 | var. |
| $KMnO_4$ | 81 g/l | | |
| $K_2MnO_4$ | 13 g/l | | |
| NaOH | 39 g/l | | |
| $Na_2CO_3$ | 88 g/l | | |
| 3. Reduction: | | 44 | 2 |
| Securiganth P 500 Reduction Solution | 100 ml/l | | |
| $H_2SO_4$ | 40 ml/l | | |
| b) gloss measurement @ 85° (after desmear) | | | |
| 4. Conditioner: | | 44 | 2 |
| Neoganth MV Conditioner | 40 ml/l | | |
| 5. Micro Etch: | | 23 | 1 |
| Sodiumperoxodisulfate | 150 g/l | | |
| $H_2SO_4$ | 15 ml/l | | |
| 6. Pre Dip: | | 23 | 1 |
| Neoganth MV Pre Dip | 10 ml/l | | |
| 7. Activator: | | 44 | 4 |
| Neoganth MV Activator | 200 ml/l | | |
| pH | 11.3 | | |
| 8. Reducer: | | 23 | 2 |
| Neoganth 406 | 2 ml/l | | |
| $H_3BO_3$ | 5 g/l | | |
| 9. Electroless Copper: | | 35 | 30 |
| Printoganth MV Plus | 2 g/l | | |
| Cu | | | |
| NaOH | 6 g/l | | |
| HCHO, 28% | 16 ml/l | | |
| 9. a) Tempering | | 150 | 30 |
| 10. Acid Cleaner: | | 23 | 4 |
| Cleaner FR | 100 ml/l | | |
| $H_2SO_4$ | 200 ml/l | | |
| 11. Acid Dip: | | 23 | 1 |
| $H_2SO_4$ | 50 ml/l | | |
| 12. Acid Copper: | | 23 | 85 |
| Cupracid HL | 18 g/l | | |
| Cu | | | |
| Current density | 2 A/dm² | | |
| 12. a) Tempering | | 170 | 30 |

Rinsing with water for 1 min after each process step (except after steps 6. & 11.)

TABLE 2

Process parameters for treatment of insulating substrates

| Desmear dwell time/min | | absolute Gloss 85° | | relative Gloss 85°/% | |
|---|---|---|---|---|---|
| Sweller | Permanganate | ABF-SH | ABF-GX | ABF-SH | ABF-GX |
| 0 | 0 | 75.0 | 85.5 | 100.0 | 100.0 |
| 1 | 2 | 71.5 | 75.5 | 95.3 | 88.3 |
| 3 | 6 | 41.5 | 49.5 | 55.3 | 57.9 |
| 5 | 10 | 27.5 | 29.5 | 36.7 | 34.5 |
| 5 | 15 | 14.0 | 19.5 | 18.7 | 22.8 |

| Peelstrength/N/cm | |
|---|---|
| ABF-SH | ABF-GX |
| 5.6 | 3.6 |
| 9.8 | 5.4 |
| 10.2 | 6.8 |
| 10.0 | 6.1 |

The invention claimed is:

1. A method for metallizing insulating substrates by etching said insulating substrates with etching solutions at a concentration, at a temperature and for a time sufficient to achieve roughening and/or desmear of the surface of said substrates and metallizing said substrates, comprising the following steps:

(A) determining optimized treatment parameters for a substrate according to steps (i) to (vi):

(i) etching the substrates using varying etching parameters selected from etching temperature, etching time and etchant concentration, (ii) determining the gloss value of the surface of the etched substrates obtained in step (i) above by an optical gloss device, (iii) metallizing the etched substrates obtained in step (i) above, (iv) determining the peel strength of the metallized substrates obtained in (iii) above, (v) correlating the peel strength and the gloss value obtained in (ii) and (iv) above, (vi) using said correlation to determine the gloss value correlating with the maximum peel strength; and (B) controlling the etching parameters during treatment of the substrate using optimized treatment parameters from (A) above—such that any deviation of the actual gloss value from the gloss value obtained in step (vi) is minimized.

2. The method according to claim 1 wherein the gloss value of the surface of said substrates is determined before etching to obtain the gloss value of the unetched surface and to calculate the relative gloss value of the surface of the etched substrates obtained in step (i) according to the following equation:

$$\text{relative gloss value} = \frac{\text{current gloss value}}{\text{gloss value of unetched surface}} \cdot 100\%$$

and wherein in steps (v), (vi) and (B) said relative gloss value is used.

3. The method according to claim 1 wherein the substrate is a printed circuit board with or without drill holes.

4. The method according to claim 1 wherein the gloss value of the surface is measured at an angle between 20-90°.

5. The method according to claim 4 wherein the gloss value of the surface is measured at an angle ranging from 40°-88°.

6. The method according to claim 3 wherein the gloss value of the surface is measured at an angle of about 85°.

7. The method according to claim 1 wherein the etching solution is a solution containing sodium or potassium permanganate, sodium or potassium manganate and sodium or potassium hydroxide.

8. The method according to claim 1 wherein the gloss value is determined at different areas of the substrate to ensure homogeneous etching processes.

9. The method according to claim 1 wherein the etching parameters are varied independently or in combination to achieve the desired gloss value.

* * * * *